US010156011B2

(12) United States Patent
Burwell et al.

(10) Patent No.: US 10,156,011 B2
(45) Date of Patent: Dec. 18, 2018

(54) APPARATUS FOR DIRECT-WRITE SPUTTER DEPOSITION AND METHOD THEREFOR

(71) Applicant: Case Western Reserve University, Cleveland, OH (US)

(72) Inventors: Edwin D. Burwell, Strongsville, OH (US); Andrew C. Barnes, Cleveland Heights, OH (US); Christian A. Zorman, Euclid, OH (US); Philip X. L. Feng, Beachwood, OH (US); R. Mohan Sankaran, University Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 125 days.

(21) Appl. No.: 14/920,293

(22) Filed: Oct. 22, 2015

(65) Prior Publication Data

US 2016/0115585 A1 Apr. 28, 2016

Related U.S. Application Data

(60) Provisional application No. 62/066,974, filed on Oct. 22, 2014.

(51) Int. Cl.
*C23C 14/34* (2006.01)
*C23C 14/35* (2006.01)
(Continued)

(52) U.S. Cl.
CPC .............. *C23C 14/35* (2013.01); *C23C 14/04* (2013.01); *C23C 14/14* (2013.01);
(Continued)

(58) Field of Classification Search
CPC .......................... H01J 37/32596; C23C 14/35
See application file for complete search history.

(56) References Cited

U.S. PATENT DOCUMENTS

| 3,836,451 A | * | 9/1974 | Snaper | .................. C23C 14/325 |
| | | | | 204/298.41 |
| 4,094,764 A | * | 6/1978 | Boucher | ............... C23C 14/228 |
| | | | | 204/192.12 |

(Continued)

OTHER PUBLICATIONS

Hopwood, et al., "A microfabricated atmospheric-pressure microplasma source operating in air", "Journal of Physics D: Applied Physics", May 20, 2005, pp. 1698-1703, vol. 38, No. 11, Publisher: Institute of Physics Publishing (IOP Publishing); http://dx.doi.org/10.1088/0022-3727/38/11/009.

*Primary Examiner* — Jason Berman
(74) *Attorney, Agent, or Firm* — Kaplan Breyer Schwarz, LLP

(57) ABSTRACT

A microplasma sputter deposition system suitable for directly writing two-dimensional and three-dimensional structures on a substrate is disclosed. Deposition systems in accordance with the present invention include a magnetic-field generator that provides a magnetic field that is aligned with the arrangement of an anode and a wire target. This results in a plasma discharge within a region between a wire target and an anode that is substantially a uniform sheet, which gives rise to the deposition of material on the substrate in highly uniform and radially symmetric fashion.

19 Claims, 5 Drawing Sheets

(51) Int. Cl.
 C23C 14/14 (2006.01)
 H01J 37/32 (2006.01)
 C23C 14/04 (2006.01)
 H01J 37/34 (2006.01)
(52) U.S. Cl.
 CPC .... *C23C 14/3414* (2013.01); *H01J 37/32596* (2013.01); *H01J 37/34* (2013.01); *H01J 37/3402* (2013.01); *H01J 37/3438* (2013.01)

(56) References Cited

U.S. PATENT DOCUMENTS

| | | | |
|---|---|---|---|
| 4,925,542 A * | 5/1990 | Kidd | C23C 14/34 |
| | | | 118/723 FI |
| 5,135,634 A * | 8/1992 | Clarke | C23C 14/34 |
| | | | 204/298.06 |
| 8,512,816 B2 | 8/2013 | Shimizu et al. | |
| 2012/0021132 A1* | 1/2012 | Shimizu | C23C 14/083 |
| | | | 427/453 |
| 2013/0022756 A1* | 1/2013 | Augustine | C23C 14/02 |
| | | | 427/551 |

* cited by examiner

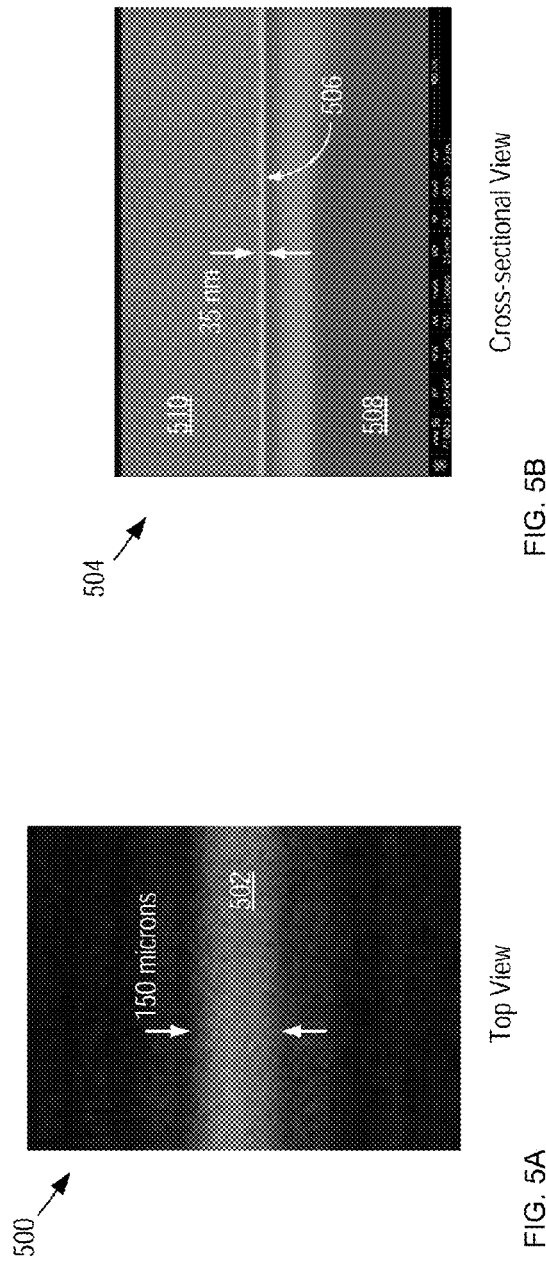
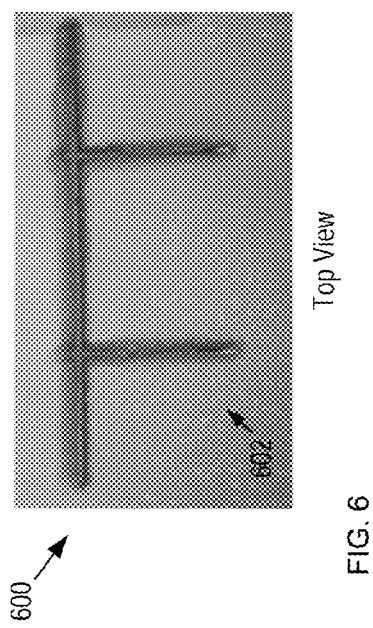
FIG. 5B
FIG. 5A
FIG. 6

APPARATUS FOR DIRECT-WRITE SPUTTER DEPOSITION AND METHOD THEREFOR

CROSS REFERENCE TO RELATED APPLICATIONS

This case claims priority of U.S. Provisional Patent Application Ser. No. 62/066,974, filed Oct. 22, 2014, which is incorporated herein by reference. If there are any contradictions or inconsistencies in language between this application and one or more of the cases that have been incorporated by reference that might affect the interpretation of the claims in this case, the claims in this case should be interpreted to be consistent with the language in this case.

STATEMENT REGARDING FEDERALLY SPONSORED RESEARCH

This invention was made with Government support under SNM-1246715 awarded by The National Science Foundation. The Government has certain rights in the invention.

FIELD OF THE INVENTION

The present invention relates to semiconductor processing in general, and, more particularly, to sputter deposition.

BACKGROUND OF THE INVENTION

Historically, integrated-circuit (IC) fabrication has been based on planar processing methods in which a stack of material layers are sequentially deposited and patterned on a semiconductor substrate. A typical material stack includes several dielectric layers (e.g., oxides, nitrides, etc.) as well as several metal layers for establishing electrical contact to individual devices, as well as interconnecting those devices to define electrical circuits.

Proper formation of the patterned metal layers is critical for successful device fabrication. In conventional planar processing, each metal layer is deposited, in blanket form, using a physical vapor deposition (PVD) process, such as thermal or e-beam evaporation or magnetron sputtering.

In an evaporation process, one (or a few) substrates are held in an evacuated reaction chamber that also holds a target of the desired metal. Heat or e-beam energy is used to melt a portion of the target. Since the chamber is under vacuum, the molten material quickly vaporizes in the low-pressure atmosphere. The vapor travels from the target to exposed surfaces that are within line of sight of the target, where it condenses to form a continuous layer. Evaporative PVD is limited to the deposition single-constituent metals having a relatively low melting point, such as aluminum and gold.

During sputter deposition, one or more substrates are collocated with a material target in a reaction chamber having a low-pressure atmosphere of inert gas. Material is liberated from the target by bombarding it with ions or atoms energized from the inert gas. The liberated material travels ballistically and deposits onto exposed surfaces, including the surface of the substrate(s). Sputtering enables deposition of metals having higher melting points (e.g., refractory metals such as tungsten, titanium-tungsten, etc.), as well as alloys or other composite materials whose deposited composition is close to that of the original target material. Unfortunately, sputter deposition is more complex than evaporation and is typically incompatible with some methods for patterning the resultant layer.

Once a blanket layer has been deposited, it is patterned by removing unwanted portions of the layer (referred to as subtractive patterning) before the deposition of the next layer. In most cases, the unwanted regions of the metal layer are removed by forming a photoresist mask on the layer that the undesired areas of the metal to a subsequent etch process. In some cases, the metal layer is patterned using a lift-off process wherein the layer is deposited over a pre-patterned layer of photoresist having openings where metal is desired. After layer deposition, the photoresist is dissolved away thereby "lifting" any metal on it and removing it from the substrate. Due to the high-energy nature of the ejected target material in sputter deposition, lift-off techniques cannot normally be used to pattern a sputtered layer.

While conventional subtractive patterning enables excellent pattern fidelity and small feature sizes, it is typically characterized by high material waste. In addition, the need to locate the substrate within an evacuated reaction chamber during evaporative or sputter deposition limits the size of the substrate and adds system cost and complexity. Further, wafer-based processing is inherently low throughput as compared to many modern manufacturing approaches, such as reel-to-reel manufacturing (a.k.a., roll-to-roll manufacturing). Still further, advancements in implantable biosensors, wearable sensors, as well as other applications, is driving a growth in the need for flexible electronics; however, conventional planar processing is normally limited to rigid substrates and not compatible with the polymer films normally used for flexible electronics substrates. Finally, the evaporative and sputtering processes used for metal deposition in planar processing approaches are characterized by high heat that can be damaging to many flexible-substrate materials.

As a result, there has been a concerted effort to develop a direct-writing process for depositing conductive material only where it is desired. To date, colloidal ink-based printing methods, such as ink-jet printing, screen printing, and aerosol printing, are the most promising additive approaches for producing directly written conductive layers.

A common feature of colloidal ink-based printing methods is the need for conductive inks, which typically include organic-ligand stabilized dispersions of metal nanoparticles. Such approaches are attractive because they can be carried out at temperatures near room temperature and substantially at atmospheric pressure.

Unfortunately, colloidal inks have many drawbacks. For example, the inks themselves can be expensive due to the number of processing steps associated with synthesis, dispersion, purification, and concentration. In addition, the variety of available materials suitable for printable inks is low. Silver is the most common commercially available ink, while other metals that are commonly used in electronic devices, such as Au, are not readily available. Further, the organic capping agents that are used to stabilize the suspended metal particles can be difficult to remove after deposition. This can lead to poor conductivity and compromised mechanical integrity and high annealing temperatures are normally required, which can limit the use of many polymers and other temperature-sensitive substrates (e.g., CMOS chips containing electronic devices). Still further, adhesion can also be a significant issue, especially for flexible-substrate applications and shelf life of colloidal inks is typically short due to issues related to maintaining a uniform suspension.

In order to avoid the drawbacks associated with colloidal inks, "ink-less" approaches have been under development. For example, e-beam exposure of films comprising metalsalt and polymer has been used to give rise to in-situ reduction and synthesis of nanoparticles in polymer films. Such ink-less processes avoid multiple processing steps and have the potential to limit organic impurities. Electron-beam-based approaches are also superior to colloidal ink-based printing in terms of pattern resolution; however, they require high vacuum, complex equipment, and must be deposited on conductive substrates. In addition, they are normally characterized by relatively low throughput. These issues remain as critical obstacles to large-scale production and wide-scale adoption of colloidal inks for direct-write electronics.

As a result, the need for a direct-write, additive process for producing patterned material layers on a wide variety of flexible and rigid substrates, which can be performed in substantially ambient conditions remains unfulfilled.

SUMMARY OF THE INVENTION

The present invention enables formation of material layers having dimensions as small as the micro- and nano-scales via a direct-write, additive process that can be performed at atmospheric pressure and at room temperature. As a result, it enables formation of patterns of any of a wide variety of source materials on any of a wide variety of substrates. The invention employs microplasma-induced sputtering to generate a narrow stream of source material that is directed toward a substrate. Embodiments of the present invention are particularly well suited for the formation of patterned conductive layers for use in the fabrication of electronic and/or micromechanical devices on rigid and/or flexible substrates.

Embodiments of the present invention have several advantages over PVD systems of the prior art, including:
  operation without the need for a vacuum environment;
  less waste;
  lower production costs;
  compatibility with large scale, reel-to-reel manufacturing;
  higher speed;
  lower processing temperatures;
  free of harsh chemicals, such as solvents and acids;
  deposition of any of a large variety of materials; and
  higher efficiency.

An illustrative embodiment of the present invention is a deposition system for directly writing conductive features on a substrate that can be electrically conductive, electrically insulating, or a combination thereof. The system includes a microplasma sputtering system, a magnetic-field generator for shaping the microplasma into a substantially uniform sheet discharge, and a stage for positioning a substrate relative to the microplasma sputtering system.

The microplasma sputtering system comprises an annular-shaped anode located on one side of a first region, a wire target of source material located on the opposite side of the first region, a high-voltage, direct-current power supply, and a gas port having an insulating outlet tube for flowing an inert gas into the first region. The target is located with the outlet tube, which is aligned with, and slightly recessed from, the aperture of the anode. The outlet tube, target, and anode are centered on a first axis that extends through the first region. The power supply is electrically connected across the anode and target such that it can induce an electrostatic breakdown between them to give rise to a microplasma in the first region.

The magnetic-field generator is arranged, relative to the microplasma sputtering system, such that it generates a magnetic field whose field lines are aligned with (i.e., substantially parallel to) the first axis.

The translation stage is a computer-controlled multi-axis stage that controls the relative position of the substrate and the sputtered-material stream, thereby enabling a desired pattern of sputtered material to be written on the substrate. In some embodiments, the stage is a roller apparatus for positioning a sheet of flexible substrate material relative to the sputtered-material stream. In some embodiments, the translation stage controls the position of the sputtered-material stream relative to the substrate. In some embodiments, the translation stage controls the positions of both the sputtered-material stream and the substrate to control their physical relationship.

In operation, the outlet tube feeds an inert gas into the first region between the target and the anode. The high-voltage supply develops a high voltage between the target and anode, giving rise to an electrostatic breakdown that produces a microplasma of energetic ions and electrons derived from the inert gas. In the electric field between the target and anode the electrons are accelerated toward the anode and the ions are accelerated toward the wire target, which they impact with sufficient energy that source material sputters from its surface. As the ions and electrons travel through the first region, they interact with the magnetic field, which causes the ions in the microplasma follow a spiral path toward the wire target. In the depicted example, the plasma discharge is a filament discharge that rotates about axis 224 due to the interaction of the ions and magnetic field 230. In some embodiments, the filament discharge rotates about the central axis at a high rate, effectively shaping the plasma discharge as a vortex-shaped plasma. In some embodiments, the swirling action of the plasma results in a plasma sheet that has a substantially uniform vortex shape. In some embodiments, magnetic field 232 and microplasma 228 interact such that the plasma discharge has a substantially uniform plasma sheet in the reaction region.

As the narrow stream of sputtered material deposits on the substrate, the stage moves the substrate as necessary to create a desired pattern of source material on its surface. By virtue of the ability to shape the plasma discharge into a desired shape (e.g., rotating filament charge, uniform vortex, uniform sheet, etc.), the sputtered material can be made to exit the insulating tube in a highly uniform, radially symmetric narrow stream that can be carried to the substrate by the gas flow. An axial symmetry of the heat loading on the substrate enables the relative positions of the stream and substrate to be changed with no directional preference.

In some embodiments, the substrate comprises a flexible substrate traversing through the microplasma region as part of a reel-to-reel production process.

An embodiment of the present invention is a direct-write deposition system comprising: (1) a microplasma sputtering system operative for sputtering a first material from a target via a plasma discharge and providing a plurality of particles that is directed toward a substrate, each of the particles comprising the first material; and (2) a magnetic-field generator operative for generating a magnetic field; wherein the sputtering system and the magnetic-field generator are arranged such that the magnetic field and the plasma discharge interact to collectively define the shape of the plasma discharge.

BRIEF DESCRIPTION OF THE DRAWINGS

FIG. 5A shows top view of a metal line formed on a rigid substrate in accordance with the illustrative embodiment.

FIG. 5B shows a cross-sectional view of a metal line formed on a rigid substrate in accordance with the illustrative embodiment.

FIG. 6 shows a top view of a metal pattern formed on a flexible substrate in accordance with the illustrative embodiment.

DETAILED DESCRIPTION

Figure 1:
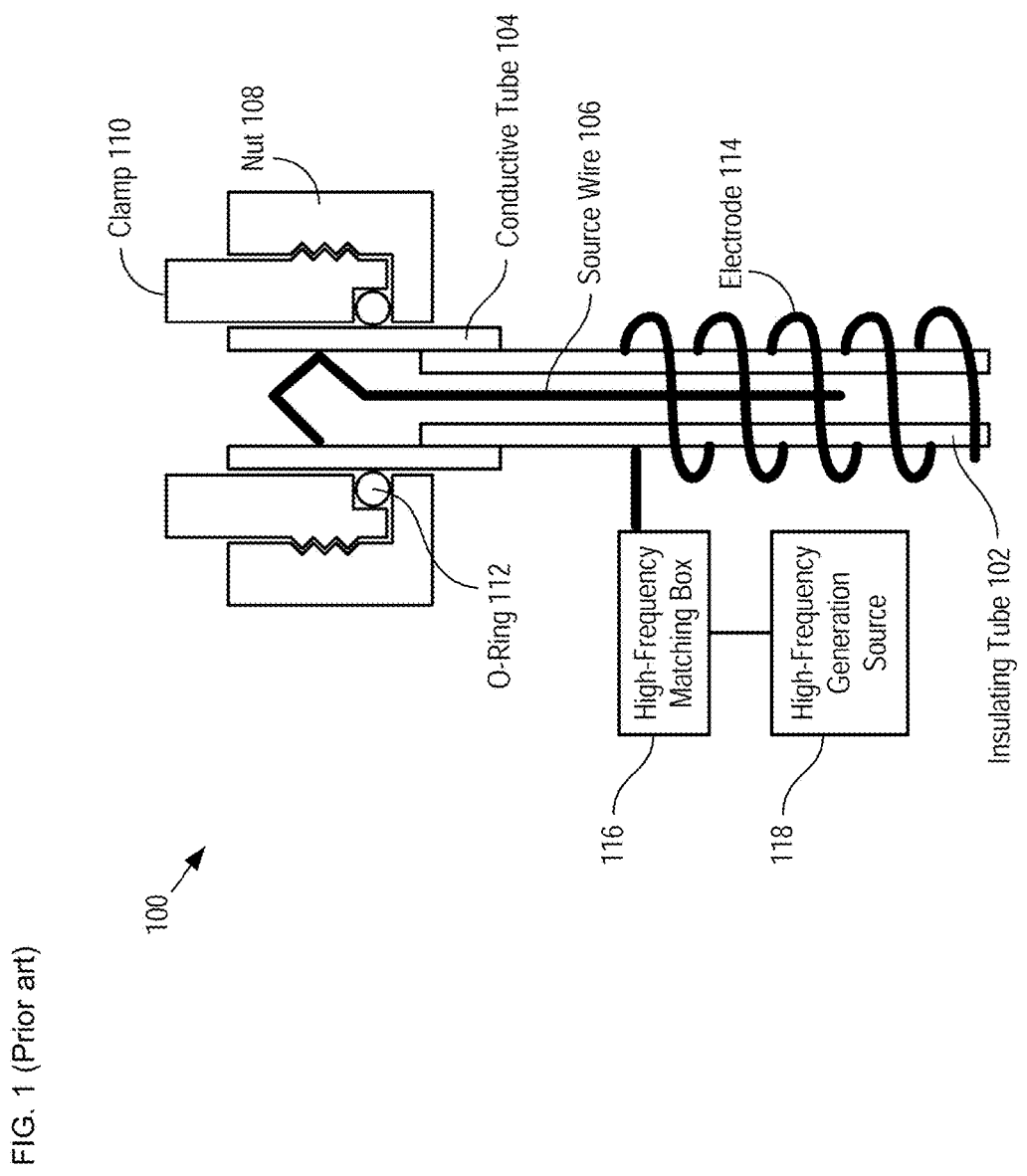
FIG. 1 depicts a schematic diagram of a microplasma-based evaporative deposition system in accordance with the prior art.

FIG. 1 depicts a schematic diagram of a microplasma-based evaporative deposition system in accordance with the prior art. System 100 comprises insulating tube 102, conductive tube 104, source wire 106, nut 108, clamp 110, O-ring 112, electrode 114, high-frequency matching box 116, and high-frequency source 118.

System 100 includes a plasma generator comprising insulating tube 102, conductive tube 104, and source wire 106. Insulating tube 102 is made of an electrically non-conductive material, such as alumina, and is located within electrically conductive tube 104. Tube 104 is typically made of a metal.

Source wire 106 is a wire of target material that is inserted into insulating tube 102 and mechanically and electrically connected to the sidewall of conductive tube 104, which is electrically connected to ground. Insulating tube 102, conductive tube 104, and source wire 106 collectively form a modular sub-system that can be easily inserted and removed from system 100.

The plasma generator is connected to a gas feed pipe via a joint comprising nut 108, clamp 110, and O-ring 112.

Electrode 114 is a conductive coil wrapped helically about insulating tube 102 and connected to high-frequency generation source 118 through high-frequency matching box 116. The other end of electrode 114 is left electrically unconnected (i.e., electrically floating). Electrode 114 is driven with a high-frequency electrical signal to generate a plasma within insulating tube 102. Electrode 114 is located in the vicinity of the outlet of insulating tube 102 so that the resultant plasma can be maintained at a high temperature at this point.

Due to the thermal conduction from the plasma, or the high-frequency heating, a region of the target material of source wire 106 evaporates and becomes activated in the plasma. The evaporated material travels to the substrate surface, where it collects to form a thin-film of target material.

One skilled in the art will recognize that system 100 is analogous to a thermal or E-beam evaporation system in that the plasma acts as a localized heat source for melting a portion of the target material. As a result, system 100 exhibits many of the same drawbacks discussed above, vis-à-vis evaporative PVD—for example, the inability to controllably deposit multi-constituent materials, such as alloys, etc., or high-melting-point materials, such as refractory metals (e.g., tungsten, titanium-tungsten, etc.), and the like. Further, because of the plasma is designed to generate high heat (i.e., sufficient to melt the target material), the variety of substrate materials with which system 100 can be used is limited.

The present invention, on the other hand, employs a microplasma that, in conjunction with an applied magnetic field, gives rise to sputter deposition of target material rather than evaporation. For the purposes of this Specification, including the appended claims, the term "sputtering" is defined bombarding a target of source material with energetic ions such that source material is ejected from the target via energy transfer from the ions, and such that the source material is ejected in the form of individual atoms or clusters of atoms or molecules. One skilled in the art will recognize that sputtering is fundamentally different from evaporation, wherein source material is melted by means of an energy source, such as a heater element, an electron beam, or a plasma, such that the molten source material can vaporize into its surrounding atmosphere. As a result of its basis on sputter deposition rather than evaporation, embodiments of the present invention can deposit target material on a wider variety of substrates, including polymer substrates. Further, embodiments of the present invention can operate in ambient conditions that include room temperature and atmospheric pressure.

Figure 2:
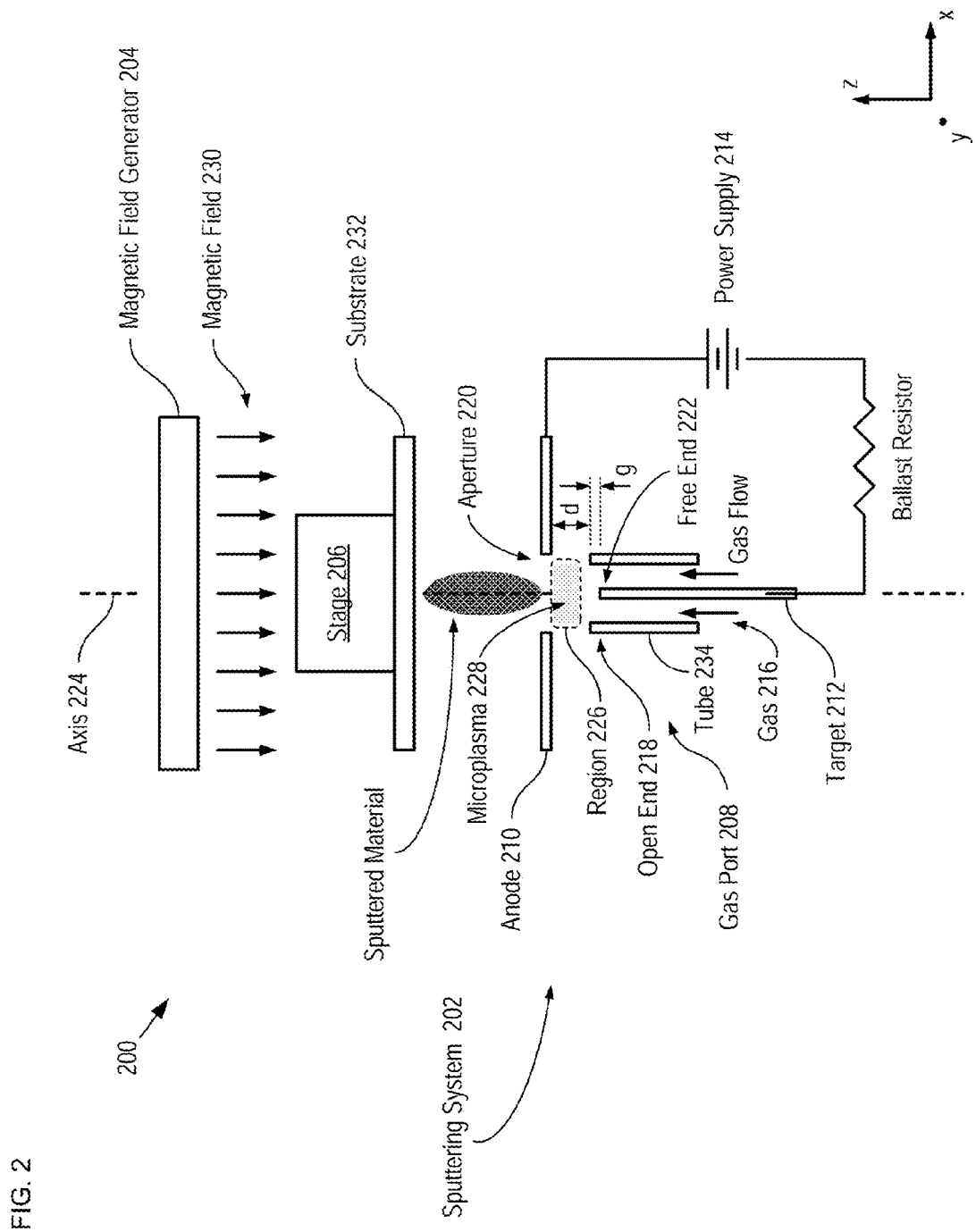
FIG. 2 depicts a schematic drawing of a direct-write sputter deposition system in accordance with an illustrative embodiment of the present invention.

FIG. 2 depicts a schematic drawing of a direct-write sputter deposition system in accordance with an illustrative embodiment of the present invention. System 200 is a direct-write material deposition system comprising sputtering system 202, magnetic-field generator 204, and stage 206. System 200 is operative for depositing a variety of target materials on a substrate in a direct write, additive process that can be performed at substantially standard temperature and pressure, where the system is capable of forming two-dimensional and three-dimensional structures having dimensions on the micro- or nanoscale in one or both of width and thickness.

Sputtering system 202 is a microplasma-based sputter-deposition system that includes gas port 208, anode 210, target 212, and power supply 214.

Figure 3:
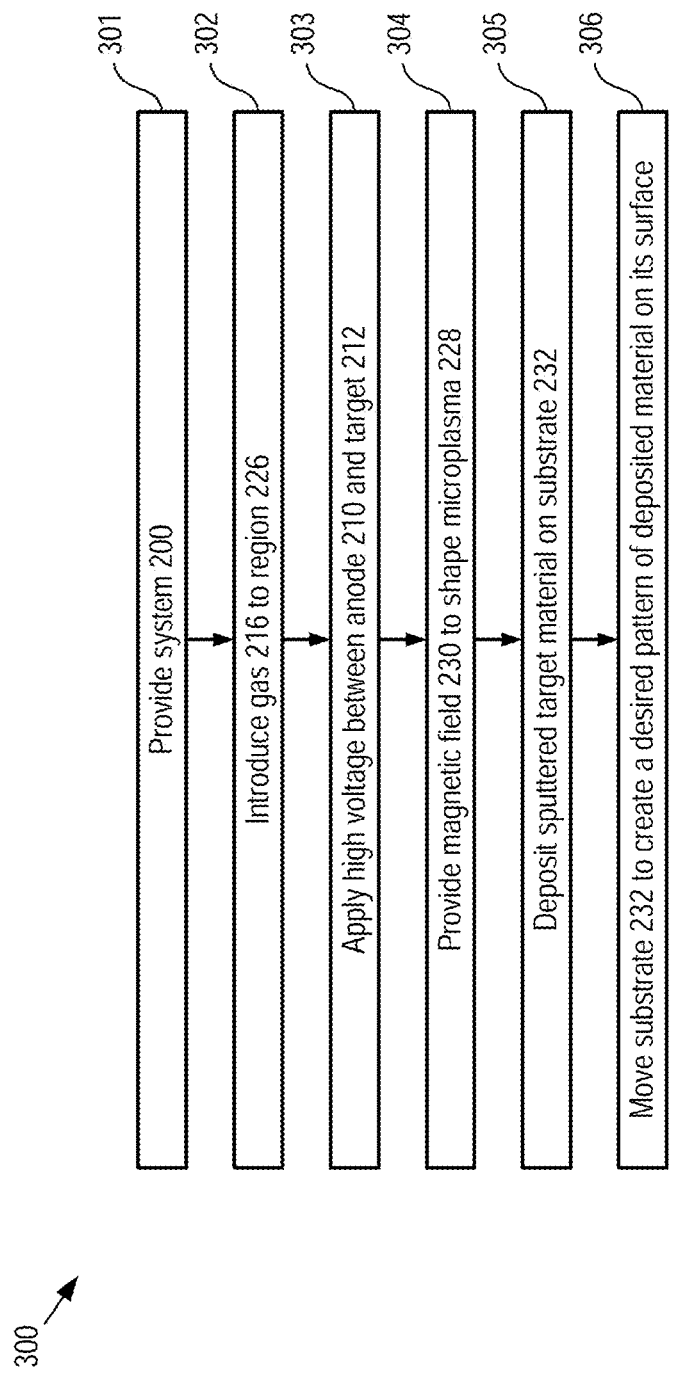
FIG. 3 depicts operations of a method suitable for forming a pattern of source material on a substrate in accordance with the illustrative embodiment of the present invention.

FIG. 3 depicts operations of a method suitable for forming a pattern of source material on a substrate in accordance with the illustrative embodiment of the present invention. Method 300 begins with operation 301, wherein system 200 is provided.

Gas port 208 includes tube 234, which is an alumina tube having an inner diameter within the range of approximately 25 microns to approximately 500 microns, and typically, 125 microns. Gas port 208 is fluidically coupled with a source of gas (not shown) and is operative for conveying gas 216 from the source to open end 218 of tube 234. In some embodiments, tube 234 comprises a different electrically insulating material. Materials suitable for use in tube 234 include, without limitation, alumina, zirconia, glass, fused silica, and the like.

Anode 210 is an annulus of electrically conductive material that is suitable for use in the proximity of a plasma discharge. Preferably the material is resistant to oxidation because metal oxides can have a deleterious impact on the plasma. Materials suitable for use in anode 210 include, without limitation, copper, gold, tungsten, or an electrically conductive material that is plated with an oxidation-resistant layer (e.g., gold, etc.). Anode 210 includes aperture 220, which is a circular opening centered in the anode having a diameter slightly larger than the outer diameter of gas port 208.

Gas port 208 and anode 210 are arranged such that the open end 218 is located within aperture 220 but such that open end 218 and anode 210 are separated by distance, d. It should be noted that the width of a line of target material deposited on substrate 232 is a function of the value of d. As a result, distance, d, is a matter of design choice; however, it is typically made small to foster the development of a high-strength electric field between anode 210 and target 212, which enables deposition of narrow features on the substrate. It should be noted that, during operation, source material can build up on the surfaces of tube 234 and lead to contact between the tube and the anode. As a result, it is preferable that the anode and tube 234 be arranged such that d is sufficient to ensure such contact does not occur. In the depicted example, d is 200 microns, which enables system 200 to define features as small as a few microns; however, in some embodiments d has another value within the range of approximately 200 microns to approximately 500 microns. In some embodiments, it is desirable to write of relatively wide features directly on a substrate and d is selected to have a value within the range of approximately 500 microns to approximately 5 mm.

Target 212 is a thin wire of tungsten-titanium alloy having free end 222. Target 212 is positioned within gas port 208 such that free end 222 is recessed from open end 218 by a slight gap, g. As a result, shielding target 212 within tube 232 mitigates heating due to exposure to microplasma 228 thereby substantially avoiding melting of the source material. In some embodiments, microplasma 228 is constrained within tube 234, which creates a higher potential different in the boundary region at the surface of target 212. This higher potential ensures that the ions striking the target have sufficient energy to sputter source material from the target rather than merely heating the source material so it can evaporate. Gas port 208, aperture 220, and target 212 are aligned along axis 224. It should be noted that the size of gap, g, affects the performance of system 200. For example, when g is too large, the amount of source material that exits gas port 208 becomes limited. If free end 222 projects past open end 218, however, heat from microplasma 228 can couple into target 212 causing excessive heating and damage (e.g., melting) of the target. Gap, g, therefore, is normally kept within the range of approximately 100 microns to approximately 200 microns.

Although, in the depicted example, target 212 comprises an alloy of tungsten and titanium, it will be clear to one skilled in the art, after reading this Specification, how to specify, make, and use alternative embodiments wherein target 212 comprises a different source material. Source materials suitable for use in embodiments of the present invention include, without limitation, high-melting-point materials, composite materials (e.g., alloys), single-constituent materials (e.g., aluminum, copper, gold, etc.), doped semiconductors, and the like.

At operation 302, gas port 208 introduces gas 216 into region 226. In the illustrative embodiment, gas 216 is argon; however, one skilled in the art will recognize that many alternative gasses (e.g., nitrogen, krypton, xenon, neon, radon, helium, compound inert gasses, etc.) can be used in system 200 without departing from the scope of the present invention.

At operation 303, power supply 214 applies a voltage between target 212 and anode 210 to give rise to an electric field across region 226. Power supply 214 is a high-power, direct-current voltage source that provides a voltage between the target and anode sufficient to initiate electrostatic breakdown across region 226, thereby generating ions and electrons from the inert gas and generating a plasma discharge (i.e., microplasma 228). The electrons are accelerated toward anode 210, while the ions are accelerated toward target 212 with enough kinetic energy sufficient to dislodge target material from the source material.

At operation 304, microplasma 228 is shaped by interacting magnetic field 230 and microplasma 228. Magnetic-field generator 204 generates the magnetic field such that it is characterized by magnetic-field lines that are substantially aligned with axis 224 (i.e., the magnetic-field lines and axis are substantially parallel). As the charged ions of the microplasma move toward target 212, their interaction with magnetic field 230 induces them to follow a spiral path inward toward target 212, resulting in a vortex-shaped plasma discharge.

Figure 4:
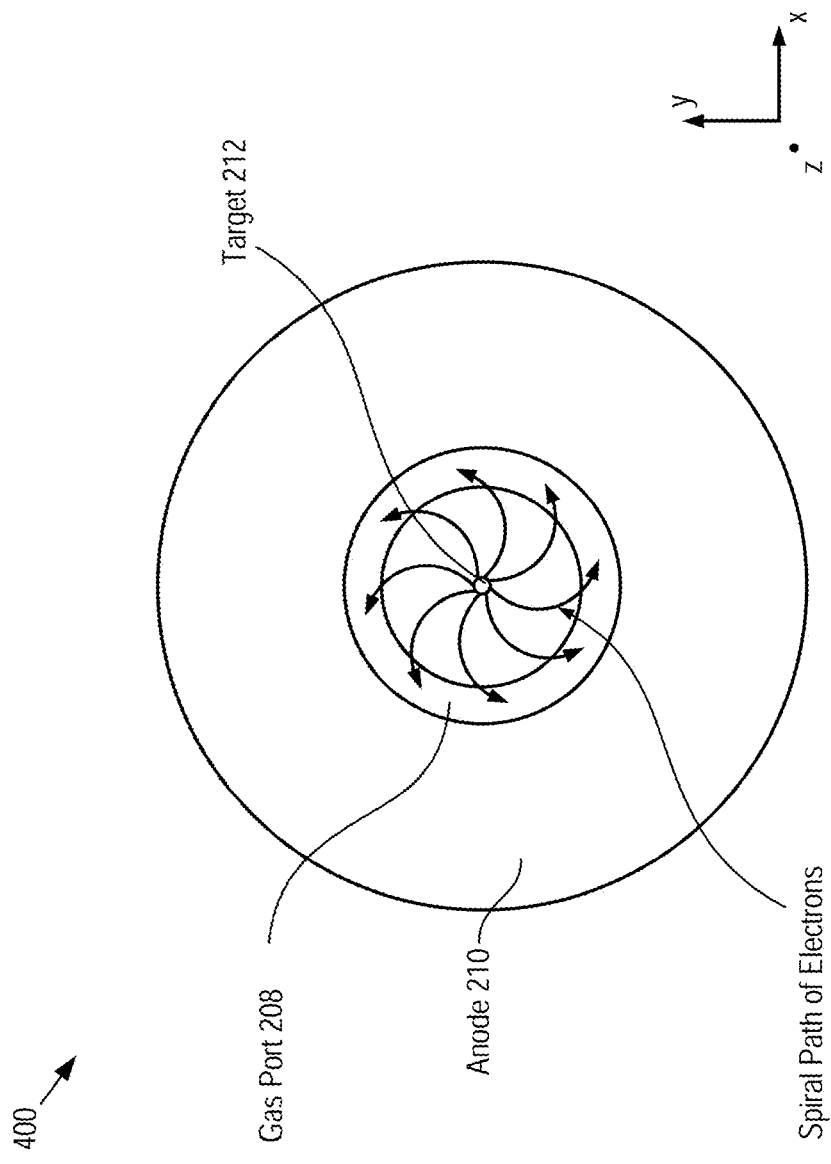
FIG. 4 depicts the spiral path of electrons in microplasma 228.

FIG. 4 depicts the spiral path of electrons in microplasma 228.

At operation 305, sputtered material exits gas port 208 and is carried by the linear momentum of the gas flow to the target to deposit as a thin film on substrate 232 in the region downstream of the assembly.

It is an aspect of the present invention that the ability to shape microplasma 228 with the application of an appropriate magnetic field affords embodiments of the present invention with significant advantages over prior art material deposition systems. For example, by shaping the microplasma into a "vortex," the swirling action of the plasma discharge results in an axially symmetric heat load on substrate 232. As a result, motion between the microplasma sputtering system and the substrate can be effected without a preferential direction. In some embodiments, magnetic field 230 is applied such that the plasma discharge is shaped into a uniform sheet that spans region 226. It should be noted that both vortex discharges and sheet discharges are preferable to a single-arc discharge, because they enable improved uniformity and radial symmetry of the sputtered material deposited on substrate 232. In addition, the application of a magnetic field, such as magnetic field 230, to a deposition system comprising an annular-shaped anode, such as sputter system 202, distributes the plasma discharge around the surface of the anode thereby reducing localized heating and/or damage to the anode. Further, it mitigates erosion of the anode material that can lead to redeposition of the material on exposed surfaces, such as tube 234, substrate 232, and the like.

It should be noted that embodiments of the present invention are operative for enabling sputter deposition of target material rather than its evaporation. As a result, there is little heat or charge build-up at the substrate. Embodiments of the present invention, therefore, are suitable for use with a variety of substrate materials, such as polymers, that are incompatible with high-temperature processes. Although in the illustrative embodiment, substrate 232 is a rigid semiconductor substrate, it will be clear to one skilled in the art, after reading this Specification, how to specify, make, and use alternative embodiments of the present invention wherein substrate 232 is a different type of substrate. Substrates suitable for use with the present invention include, without limitation, substrates that are rigid, flexible, semi-rigid, electrically conductive, electrically non-conductive, and the like.

At operation 306, stage 206 moves substrate 232 along a desired path to form a desired pattern of deposited material on its surface. Typically, stage 206 is a precision, computer-controlled two-dimensional translation stage. In some embodiments, stage 206 is a different suitable stage. In some embodiments, substrate 232 remains fixed in space and at least a portion of system 200 is moved to create the desired pattern of source material on the substrate surface. In some embodiments, substrate 232 is a sheet of a flexible polymer and stage 206 is a roll-coating apparatus analogous to that of a conventional high-volume, reel-to-reel process.

FIG. 5A shows top view of a metal line formed on a rigid substrate in accordance with the illustrative embodiment. Plot 500 depicts line 502, which is a contiguous line of gold having a substantially uniform width of 150 microns. Line 502 was formed by moving the substrate linearly relative to a deposition system analogous to system 200 described above.

FIG. 5B shows a cross-sectional view of a metal line formed on a rigid substrate in accordance with the illustrative embodiment. Plot 505 depicts line 506, which is a contiguous line of gold having a substantially uniform thickness of approximately 35 nanometers. Line 506 is disposed on conventional glass substrate 508 and coated with platinum layer 510 to protect it during the focused-ion beam process used to prepare the sample for analysis.

FIG. 6 shows a top view of a metal pattern formed on a flexible substrate in accordance with the illustrative embodiment. Plot 600 depicts pattern 602, which is an arrangement of gold lines, each having a width of approximately 150 microns. Pattern 602 is disposed on a substrate comprising a conventional liquid-crystal polymer.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A direct-write deposition system comprising:
   (1) a microplasma sputtering system configured to sputter a first material from a target via a plasma discharge and providing a plurality of particles that is directed toward a substrate, each of the particles comprising the first material, wherein the microplasma sputtering system includes;
      (i) an anode, the anode having an annular shape that surrounds an aperture;
      (ii) the target, wherein the anode and target collectively define a first region, and wherein the aperture and target are concentric along a first axis through the first region;
      (iii) a gas port that includes a tube that is configured to direct a flow of an inert gas along the first axis such that the inert gas flows through the aperture and the first region and toward the substrate, wherein the tube comprises a second material that is an electrical insulator, and wherein the target is located completely within the tube; and
      (iv) a power supply that is configured to generate an electric field that gives rise to the plasma discharge that produces a plurality of ions from the inert gas; and
   (2) a magnetic-field generator configured to generate a magnetic field whose magnetic-field lines are substantially aligned with the first axis;
   wherein the sputtering system and the magnetic-field generator are arranged such that (a) the magnetic field and the plasma discharge interact to collectively define the shape of the plasma discharge and (b) the magnetic field and the ions interact such that the ions are accelerated toward the target with sufficient energy to induce sputtering of first material from its surface and such that the plasma discharge is directed toward the target.

2. The deposition system of claim 1 further comprising: (3) a stage operative for controlling the relative position of the microplasma sputtering system and the substrate.

3. The deposition system of claim 2 wherein the stage is further operative for positioning a first layer relative to the microplasma sputtering system, the first layer being a flexible layer, and the substrate including the first layer.

4. The deposition system of claim 1 wherein power supply is a direct-current voltage source.

5. The deposition system of claim 1 wherein the sputtering system and the magnetic-field generator direct the ions toward the target along a spiral path and collectively define the shape of the plasma discharge as a vortex.

6. The deposition system of claim 1 wherein the sputtering system and the magnetic-field generator collectively define the shape of the plasma discharge as a substantially uniform sheet.

7. A direct-write deposition system comprising:
   a gas port including a tube of a first material, the first material being electrically insulating, the gas port being configured to direct a flow of an inert gas along a first direction through a first region toward a substrate;
   an anode, the anode being an annulus having a first aperture;
   a target comprising a second material and being located completely within tube such that the target and the anode are separated by the first material, and wherein the anode and target collectively define the first region;
   a power supply that is operative for providing a voltage differential between the anode and the target, wherein the anode, target, and power supply are collectively operative for producing a plasma discharge in the first region; and
   a magnetic-field generator operative for generating a magnetic field characterized by magnetic-field lines that are substantially aligned with the first direction;
   wherein the anode, target, and magnetic-field generator are arranged such that the plasma discharge and the magnetic field interact to (1) collectively define the shape of the plasma discharge, (2) direct the plasma discharge toward the target, and (3) configure the plasma discharge to sputter a plurality of particles from the target, each of the plurality of particles comprising the second material; and
   wherein the flow of the inert gas is operative for forming the plurality of particles into a stream directed toward the substrate along the first direction.

8. The deposition system of claim 7 further comprising a stage, the stage being operative for establishing a relative position of the stream and a substrate.

9. The deposition system of claim 7, wherein the plasma discharge contains a plurality of ions, and wherein the magnetic field and the ions of the plurality thereof interact to direct each of the plurality of ions along a substantially spiral path within the first region.

10. The deposition system of claim 9, wherein the shape of the plasma discharge is a vortex.

11. The deposition system of claim 7, wherein the shape of the plasma discharge is a substantially uniform sheet.

12. The deposition system of claim 7, wherein the second material is a metallic alloy.

13. The deposition system of claim 7, wherein the second material is a refractory metal.

14. A method for depositing a first material on a substrate, the method comprising:
   creating a plasma discharge in a first region between a target and an anode that has an annular shape that surrounds an aperture, wherein the anode and the target are concentric along a first axis through the first region;

interacting a magnetic field and the plasma discharge to shape the plasma discharge into a first shape, wherein the magnetic field is characterized by magnetic-field lines that are substantially aligned with the first direction and is configured to direct the plasma discharge toward the target;

configuring the plasma discharge to sputter a plurality of particles from the target, each of the particles comprising the first material; and directing a flow of an inert gas through the aperture along the first axis to direct a particle stream along the first axis such that the particle stream flows through the first region and toward the substrate, wherein the particle stream includes the plurality of particles.

15. The method of claim 14 wherein the first shape is a vortex.

16. The method of claim 14 wherein the first shape is a substantially uniform sheet.

17. The method of claim 14 further comprising controlling the position of at least one of the particle stream and the substrate to create a pattern of first material on the substrate.

18. The method of claim 14 wherein the plasma discharge and magnetic field are interacted such that each of a plurality of ions contained in the plasma discharge travel toward the target along a substantially spiral path.

19. The method of claim 14 further comprising locating the target in a tube that is electrically insulating, wherein the location of the target in the tube mitigates heating of the target by the plasma discharge.

* * * * *